United States Patent
Deng et al.

(10) Patent No.: US 12,111,671 B2
(45) Date of Patent: Oct. 8, 2024

(54) MASS FLOW CONTROLLER AND FLOW CONTROL METHOD THEREFOR

(71) Applicant: BEIJING SEVENSTAR FLOW CO., LTD., Beijing (CN)

(72) Inventors: Bowen Deng, Beijing (CN); Changhua Mu, Beijing (CN); Yitao Zou, Beijing (CN)

(73) Assignee: BEIJING SEVENSTAR FLOW CO., LTD., Beijing (CN)

( * ) Notice: Subject to any disclaimer, the term of this patent is extended or adjusted under 35 U.S.C. 154(b) by 0 days.

(21) Appl. No.: 18/562,942

(22) PCT Filed: May 27, 2022

(86) PCT No.: PCT/CN2022/095493
§ 371 (c)(1),
(2) Date: Nov. 21, 2023

(87) PCT Pub. No.: WO2022/247926
PCT Pub. Date: Dec. 1, 2022

(65) Prior Publication Data
US 2024/0231398 A1    Jul. 11, 2024

(30) Foreign Application Priority Data

May 28, 2021  (CN) .......................... 202110594358.1

(51) Int. Cl.
*G05D 7/06* (2006.01)
*C23C 16/44* (2006.01)
(Continued)

(52) U.S. Cl.
CPC ....... *G05D 7/0635* (2013.01); *C23C 16/4412* (2013.01); *C23C 16/45525* (2013.01);
(Continued)

(58) Field of Classification Search
CPC ...... G05D 7/0635; G05D 7/06; G05D 7/0623; G05D 16/20; G05D 16/2022; F16K 1/54;
(Continued)

(56) References Cited

U.S. PATENT DOCUMENTS 5,475,614 A    12/1995 Tofte
5,865,205 A *  2/1999 Wilmer ................ G05D 7/0635
                                                       73/1.16
(Continued)

FOREIGN PATENT DOCUMENTS

CN        1643466       10/2008
CN        101762299      5/2014
(Continued)

OTHER PUBLICATIONS

International Search Report Dated Aug. 16, 2022.
(Continued)

*Primary Examiner* — Minh Q Le
(74) *Attorney, Agent, or Firm* — IPSILON USA, LLP

(57) ABSTRACT

A mass flow controller includes control module, fluid passage, flow regulating valve, flow sensor disposed between inlet and flow regulating valve, and pressure sensor disposed at outlet. The control module is configured to enter pressure feedback regulation mode when variation amount of target flow value exceeds preset threshold, and enter flow feedback regulation mode after fluid flow value detected by flow sensor meets first stabilization condition. The control module is configured to, in pressure feedback regulation mode, perform calculation according to fluid pressure value and target flow value to obtain opening regulation amount, and regulate opening degree of flow regulating valve according to opening regulation amount. The control module is also configured to, in flow feedback regulation mode, perform calculation according to fluid flow value and target flow (Continued)

value to obtain opening regulation amount, and regulate opening degree of flow regulating valve according to opening regulation amount.

11 Claims, 9 Drawing Sheets

(51) Int. Cl.
    *C23C 16/455*      (2006.01)
    *C23C 16/52*      (2006.01)
    *F16K 1/12*      (2006.01)
    *F16K 1/54*      (2006.01)

(52) U.S. Cl.
    CPC ........ *C23C 16/45546* (2013.01); *C23C 16/52* (2013.01); *F16K 1/12* (2013.01); *F16K 1/54* (2013.01); *G05D 7/06* (2013.01)

(58) Field of Classification Search
    CPC .... F16K 1/12; G05B 1/11; G05B 6/05; G05B 11/06; G05B 19/43; G05B 24/04; C23C 16/45525; C23C 16/52; C23C 16/45546; C23C 16/4412
    USPC ............ 137/486, 487.5; 156/345.15, 345.24, 156/345.26; 118/715
    See application file for complete search history.

(56) References Cited

U.S. PATENT DOCUMENTS

| | | | | |
|---|---|---|---|---|
| 6,138,708 | A * | 10/2000 | Waldbusser | G05D 7/005 137/341 |
| 6,655,408 | B2 * | 12/2003 | Linthorst | G05D 7/0635 700/282 |
| 8,789,556 | B2 * | 7/2014 | Yasuda | G05D 7/06 702/113 |
| 10,503,179 | B2 | 12/2019 | Hayashi | |
| 10,534,376 | B2 * | 1/2020 | Nishino | G05D 7/0641 |
| 11,435,764 | B1 * | 9/2022 | Smirnov | G05D 7/0635 |
| 2006/0237063 | A1 * | 10/2006 | Ding | G05D 11/132 137/487.5 |
| 2009/0095068 | A1 * | 4/2009 | Redemann | G05D 7/0635 73/202 |
| 2009/0248213 | A1 * | 10/2009 | Gotoh | G05D 7/0635 700/282 |
| 2010/0000608 | A1 * | 1/2010 | Goto | G01F 25/15 137/455 |
| 2011/0135821 | A1 * | 6/2011 | Ding | G05D 16/02 118/692 |
| 2013/0092256 | A1 * | 4/2013 | Yasuda | G01F 1/696 137/487 |
| 2013/0092258 | A1 * | 4/2013 | Yasuda | G01F 1/6842 137/487 |
| 2013/0146148 | A1 | 6/2013 | Smirnov | |
| 2014/0182692 | A1 * | 7/2014 | Hirata | G01F 1/50 137/486 |
| 2015/0234393 | A1 * | 8/2015 | Kehoe | G05D 7/0635 137/455 |
| 2015/0276449 | A1 * | 10/2015 | Ito | G01F 1/698 73/861.351 |
| 2017/0115150 | A1 * | 4/2017 | Ikeuchi | G01F 1/6842 |
| 2017/0131127 | A1 * | 5/2017 | Ishii | G01F 5/00 |
| 2019/0354120 | A1 * | 11/2019 | Takijiri | F16K 17/025 |
| 2020/0073414 | A1 * | 3/2020 | Lull | G05D 7/0623 |
| 2020/0133313 | A1 * | 4/2020 | Sipka | G05B 23/027 |
| 2020/0232873 | A1 * | 7/2020 | Nagase | G05D 7/0635 |
| 2022/0390269 | A1 * | 12/2022 | Hidaka | G01F 1/363 |

FOREIGN PATENT DOCUMENTS

| | | |
|---|---|---|
| CN | 112000139 | 11/2020 |
| CN | 112000160 | 11/2020 |
| CN | 113311881 | 8/2021 |
| CN | 113485470 | 10/2021 |
| CN | 108227763 | 7/2022 |
| CN | 112327948 | 1/2024 |

OTHER PUBLICATIONS

CN202110594358.1 Office Action dated May 18, 2022.
CN202110594358.1 Office Action dated May 18, 2022 (eng trans).
CN202110594358.1 Notice of Allowance dated Sep. 15, 2022.
CN202110594358.1 Notice of Allowance dated Sep. 15, 2022 (eng trans).
CN202110594358.1 Issued Claims dated Dec. 13, 2022.
CN202110594358.1 Issued Claims dated Dec. 13, 2022 (eng trans).

* cited by examiner

MASS FLOW CONTROLLER AND FLOW CONTROL METHOD THEREFOR

RELATED APPLICATION

This application is a National Phase of PCT/CN2022/095493 filed on May 27, 2022, which claims the benefit of priority from Chinese Patent Application No. 202110594358.1 filed on May 28, 2021, the entirety of which are incorporated by reference.

TECHNICAL FIELD

The present disclosure relates to the field of semiconductor process equipment, and in particular, to a mass flow controller and a flow control method of the mass flow controller.

BACKGROUND

A mass flow controller is a core component in semiconductor process equipment, and is widely applied to the fields of semiconductor, photovoltaics, fuel cells, vacuum technology and the like. The mass flow controller generally includes a flow regulating valve and a flow detecting device, and can detect a mass flow of a fluid with the flow detecting device while controlling a flow of the fluid flowing through the mass flow controller by adjusting an opening degree of the flow regulating valve, thereby ensuring precision of control of a flow rate.

In order to realize high-precision and high-stability flow control, a thermal flowmeter is usually used as the flow detecting device in the mass flow controller, that is, the thermal flowmeter is configured to measure the mass flow of the fluid, and then the opening degree of the flow regulating valve is regulated by a closed-loop control system adopting a Proportional Integral Differential (PID) algorithm, so as to achieve a stable flow.

However, the mass flow controller adopting the thermal flowmeter needs a relatively long response time for making the flow reach a stable value, and cannot be applied to the fields with a relatively high requirement on the response time.

SUMMARY

The present disclosure aims to provide a mass flow controller and a flow control method, and the mass flow controller can realize quick response while ensuring flow control precision.

In order to achieve the above objective, in one aspect of the present disclosure, there is provided a mass flow controller, with a fluid passage provided in the mass flow controller, and a flow regulating valve connected between an inlet of the fluid passage and an outlet of the fluid passage. The mass flow controller further includes a control module, a flow sensor, and a pressure sensor, wherein the flow sensor is disposed between the inlet and the flow regulating valve, and is configured to detect a fluid flow value of the fluid passage; the pressure sensor is disposed at the outlet, and is configured to detect a fluid pressure value of the fluid passage; the control module is configured to enter a pressure feedback regulation mode when a variation amount of a target flow value exceeds a preset threshold, and enter a flow feedback regulation mode after the fluid flow value detected by the flow sensor meets a first stabilization condition, wherein the control module is configured to, in the pressure feedback regulation mode, perform a calculation according to the fluid pressure value detected by the pressure sensor and a target pressure value corresponding to the target flow value to obtain an opening regulation amount of the flow regulating valve, and regulate an opening degree of the flow regulating valve according to the opening regulation amount; and the control module is configured to, in the flow feedback regulation mode, perform a calculation according to the fluid flow value detected by the flow sensor and the target flow value to obtain an opening regulation amount of the flow regulating valve, and regulate the opening degree of the flow regulating valve according to the opening regulation amount.

Optionally, the control module is further configured to, before entering the pressure feedback regulation mode, acquire a target opening degree of the flow regulating valve corresponding to the target flow value, regulate the opening degree of the flow regulating valve according to the target opening degree, and enter the pressure feedback regulation mode after the fluid pressure value detected by the pressure sensor meets a second stabilization condition.

Optionally, a plurality of flow set values and opening degrees respectively corresponding to the plurality of flow set values are stored in the control module; and the control module is configured to perform a calculation by interpolation according to two of the flow set values closest to the target flow value and the opening degrees corresponding to the two of the flow set values to obtain the target opening degree corresponding to the target flow value.

Optionally, the flow regulating valve is a solenoid valve, and the opening degrees corresponding to each of the flow set values include an up opening degree and a down opening degree; and the control module is configured to, in a case where the target flow value is increased, perform the calculation by interpolation according to the two of the flow set values closest to the target flow value and up opening degrees corresponding to the two of the flow set values to obtain the target opening degree corresponding to the target flow value, and to, in a case where the target flow value is decreased, perform the calculation by interpolation according to the two of the flow set values closest to the target flow value and down opening degrees corresponding to the two of the flow set values to obtain the target opening degree corresponding to the target flow value.

Optionally, the flow sensor is a thermal flow sensor.

Optionally, the first stabilization condition is: a difference between a maximum value and a minimum value among all fluid flow values detected by the flow sensor during a first preset time is less than or equal to a first preset difference; and the second stabilization condition is: a difference between a maximum value and a minimum value among all fluid pressure values detected by the pressure sensor during a second preset time is less than or equal to a second preset difference.

Optionally, the control module is further configured to enter the flow feedback regulation mode when the variation amount of the target flow value does not exceed the preset threshold.

In another aspect of the present disclosure, there is provided a flow control method of a mass flow controller, and the flow control method is applied to the mass flow controller provided above, and includes: entering a pressure feedback regulation mode when a variation amount of a target flow value exceeds a preset threshold, and in the pressure feedback regulation mode, performing a calculation according to a fluid pressure value detected by the pressure sensor and a target pressure value corresponding to the target flow value to obtain an opening regulation amount of the flow regulating valve, and regulating an opening degree of the flow regulating valve according to the opening regulation amount; and entering a flow feedback regulation mode after a fluid flow value detected by the flow sensor meets a first stabilization condition, and in the flow feedback regulation mode, performing a calculation according to the fluid flow value detected by the flow sensor and the target flow value to obtain an opening regulation amount of the flow regulating valve, and regulating the opening degree of the flow regulating valve according to the opening regulation amount.

Optionally, the flow control method further includes: entering the flow feedback regulation mode when the variation amount of the target flow value does not exceed the preset threshold.

Optionally, before entering the pressure feedback regulation mode, the flow control method further includes: acquiring a target opening degree of the flow regulating valve corresponding to the target flow value, and regulating the opening degree of the flow regulating valve according to the target opening degree; and entering the pressure feedback regulation mode after the fluid pressure value detected by the pressure sensor meets a second stabilization condition.

Optionally, acquiring the target opening degree of the flow regulating valve corresponding to the target flow value includes: determining, according to a plurality of flow set values and target opening degrees respectively corresponding to the plurality of flow set values that are stored in advance, two of the flow set values closest to the target flow value and the opening degrees corresponding to the two of the flow set values, and performing a calculation by interpolation to obtain the target opening degree corresponding to the target flow value.

Optionally, the flow regulating valve is a solenoid valve, and the opening degrees corresponding to each of the flow set values include an up opening degree and a down opening degree; and acquiring the target opening degree of the flow regulating valve corresponding to the target flow value includes: in a case where the target flow value is increased, determining, according to the plurality of flow set values and up opening degrees respectively corresponding to the plurality of flow set values that are stored in advance, the two of the flow set values closest to the target flow value and the up opening degrees corresponding to the two of the flow set values, and performing the calculation by interpolation to obtain the target opening degree corresponding to the target flow value; and in a case where the target flow value is decreased, determining, according to the plurality of flow set values and down opening degrees respectively corresponding to the plurality of flow set values that are stored in advance, the two of the flow set values closest to the target flow value and the down opening degrees corresponding to the two of the flow set values, and performing the calculation by interpolation to obtain the target opening degree corresponding to the target flow value.

The technical solutions of the mass flow controller and the flow control method provided herein combine the pressure feedback regulation mode with a high response speed and the flow feedback regulation mode with high precision, that is, when the variation amount of the target flow value exceeds the preset threshold, the pressure feedback regulation mode is firstly entered, the opening degree of the flow regulating valve is quickly made to approach the target opening degree through the pressure feedback regulation, then the pressure feedback regulation mode is switched to the flow feedback regulation mode, and the opening degree of the flow regulating valve is precisely regulated through the flow feedback regulation. Compared with an existing method of only adopting the flow feedback regulation mode, the combination of the pressure feedback regulation mode and the flow feedback regulation mode can shorten regulation time for making the opening degree of the flow regulating valve gradually approach to the target opening degree, so that a response speed of the mass flow controller can be increased while precision of fluid flow regulation is ensured.

BRIEF DESCRIPTION OF DRAWINGS

The accompany drawings are intended to provide a further understanding of the present disclosure and constitute a part of the specification. Together with the following specific implementations, the drawings are used to explain the present disclosure, but do not constitute any limitation to the present disclosure. In the drawings.

DETAIL DESCRIPTION OF EMBODIMENTS

The specific implementations of the present disclosure will be described in detail below with reference to the drawings. It should be understood that the specific implementations described herein are only for illustrating and explaining the present disclosure, rather than limiting the present disclosure.

Through experimental research, it has been found that the conventional mass flow controller generally has the problems of low response speed and low flow regulation efficiency when a flow regulation amount is relatively large, and the problems are mainly caused by properties of the thermal flowmeter. Specifically, a principle of the thermal flowmeter for detecting a flow is: when a fluid flows in a sensing tube, temperatures of the fluid when flowing through two different positions of the sensing tube, i.e., an upstream temperature and a downstream temperature, are detected, there is a temperature difference between the two temperatures, and the temperature difference increases with an increase of the flow of the fluid, based on which, the flow of the fluid may be detected by detecting the temperature difference. However, it takes a relatively long time to detect changes of the upstream temperature and the downstream temperature. Therefore, although the thermal flowmeter is high in precision and stability, due to influences of the inherent physical properties and a relatively long temperature sampling period of the thermal flowmeter, a response speed of the conventional mass flow controller for making the flow reach a stable value through PID closed-loop control is relatively low, so that the conventional mass flow controller cannot realize quick response.

Figure 1:
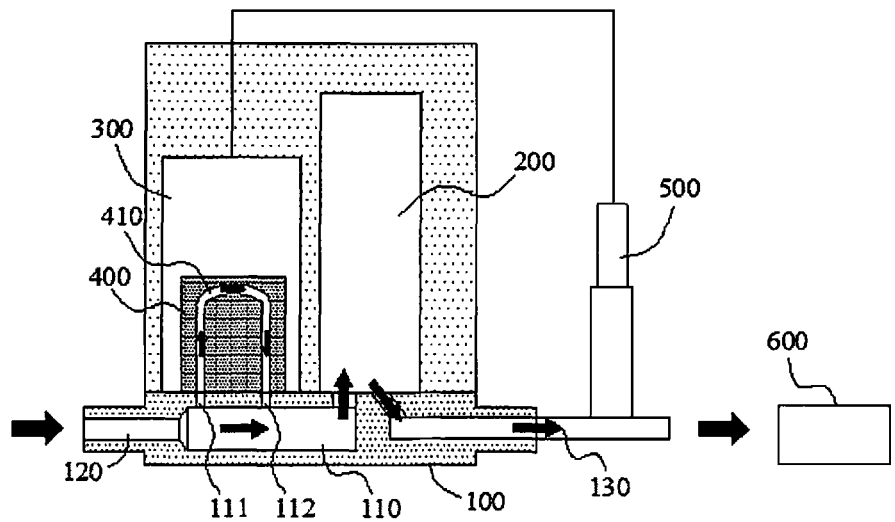
FIG. 1 is a schematic structural diagram of a mass flow controller according to an embodiment of the present disclosure.

In order to solve the above technical problem, in an aspect of the present disclosure, there is provided a mass flow controller. As shown in FIG. 1, in the mass flow controller, a fluid passage for conveying a fluid is provided, and a flow regulating valve 200 is connected between an inlet (i.e., a left opening of the mass flow controller in FIG. 1) and an outlet (i.e., a right opening of the mass flow controller in FIG. 1) of the fluid passage; and the mass flow controller further includes a control module 300, a flow sensor 400, and a pressure sensor 500. The flow sensor 400 is disposed between the inlet of the fluid passage and the flow regulating valve 200, and is configured to detect a flow value of the fluid (e.g., a gas or a liquid) in the fluid passage; and the pressure sensor 500 is disposed at the outlet of the fluid passage, and is configured to detect a pressure value of the fluid in the fluid passage.

Figure 3:
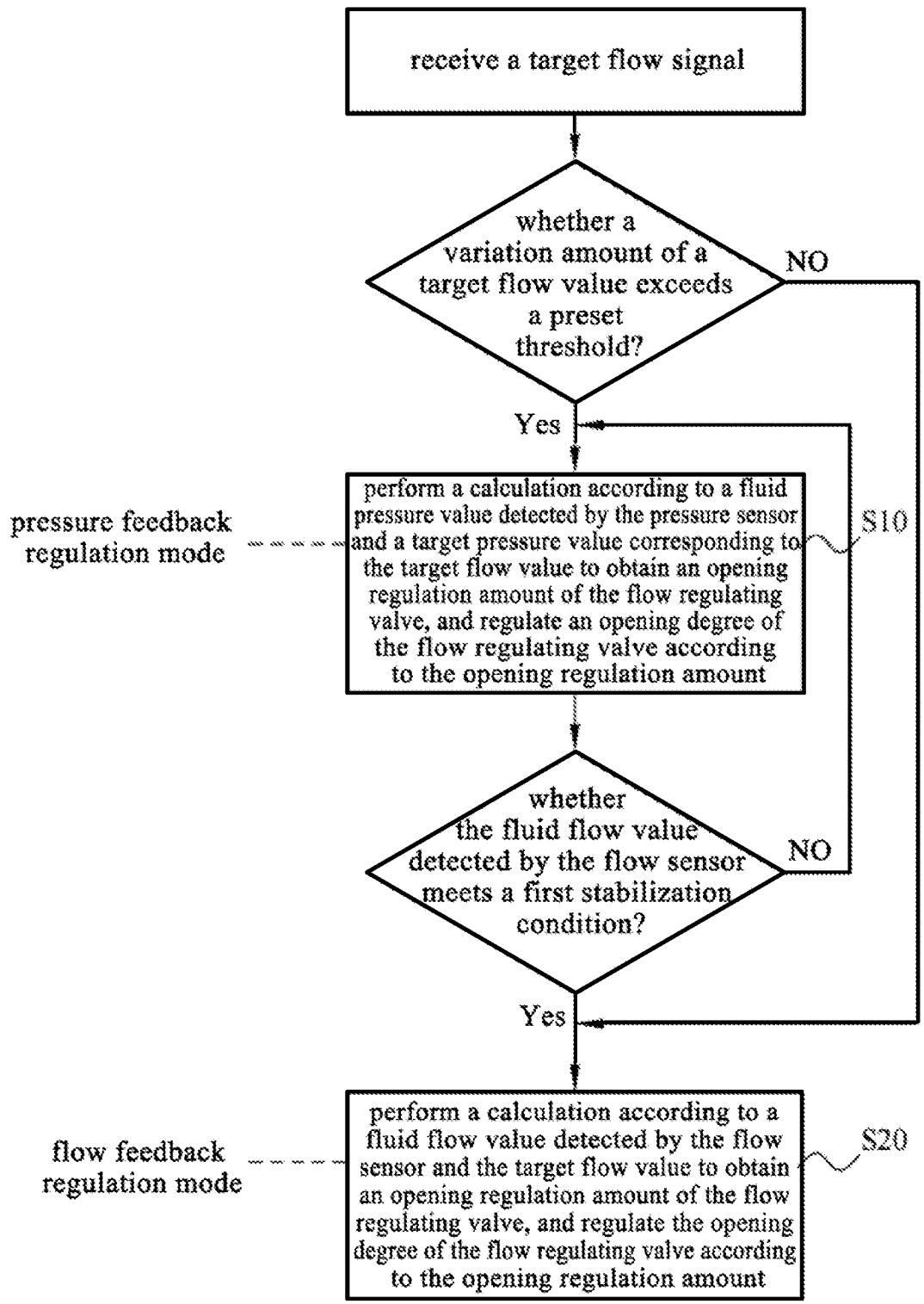
FIG. 3 is a flowchart of a flow control method according to an embodiment of the present disclosure.

As shown in FIG. 3, the control module 300 is configured to enter a pressure feedback regulation mode when a variation amount of a target flow value exceeds a preset threshold, and enter a flow feedback regulation mode after a fluid flow value detected by the flow sensor meets a first stabilization condition.

The control module 300 is configured to, in the pressure feedback regulation mode, perform a calculation according to a fluid pressure value detected by the pressure sensor and a target pressure value corresponding to the target flow value to obtain an opening regulation amount of the flow regulating valve 200, and regulate an opening degree of the flow regulating valve 200 according to the opening regulation amount (i.e., performing step S10 shown in FIG. 3).

The control module 300 is configured to, in the flow feedback regulation mode, perform a calculation according to the fluid flow value detected by the flow sensor and the target flow value to obtain an opening regulation amount of the flow regulating valve 200, and regulate the opening degree of the flow regulating valve 200 according to the opening regulation amount (i.e., performing step S20 shown in FIG. 3).

The target flow value is a target value actually desired to be reached and may be set according to specific needs, and the variation amount of the target flow value is a variation amount generated when the target flow value is switched from a current set value to a new set value. The target pressure value corresponding to the target flow value may be also set in advance, and may be stored in the control module 300 in advance.

In some alternative embodiments, in the pressure feedback regulation mode, performing the calculation according to the fluid pressure value detected by the pressure sensor 500 and the target pressure value corresponding to the target flow value to obtain the opening regulation amount of the flow regulating valve 200 and regulating the opening degree of the flow regulating valve 200 according to the opening regulation amount may specifically include: according to a fluid pressure value of the fluid passage detected periodically or in real time by the pressure sensor 500 at a position (e.g., the outlet of the fluid passage) downstream of the flow regulating valve 200, continuously performing a difference operation, for example, by the PID algorithm, on the detected fluid pressure value and the target pressure value corresponding to the target flow value, and then continuously regulating the opening degree of the flow regulating valve 200 according to an opening regulation amount obtained by each operation, so as to make a pressure of the fluid gradually approach the target pressure value corresponding to the target flow value and be stabilized at the target pressure value corresponding to the target flow value. Apparently, in practical applications, other algorithms may be used to perform the calculation to obtain the opening regulation amount, which is not particularly limited in the embodiments of the present disclosure.

Similarly, in the flow feedback regulation mode, performing the calculation according to the fluid flow value detected by the flow sensor 400 and the target flow value to obtain the opening regulation amount of the flow regulating valve 200 and regulating the opening degree of the flow regulating valve 200 according to the opening regulation amount may specifically include: according to a fluid flow value of the fluid passage detected in real time by the flow sensor 400 at a position (e.g., the inlet of the fluid passage) upstream of the flow regulating valve 200, continuously performing a difference operation, for example, by the PID algorithm, on the detected fluid flow value and the target flow value, and then continuously regulating the opening degree of the flow regulating valve 200 according to an opening regulation amount obtained by each operation, so as to make a flow of the fluid gradually approach the target flow value and be stabilized at the target flow value. A structure of the flow sensor 400 is not specifically limited in the embodiments of the present disclosure. For example, the flow sensor 400 is preferably a thermal flowmeter.

The fluid flow value detected by the flow sensor 400 and the fluid pressure value detected by the pressure sensor 500 are both linearly related to the opening degree (a flow of the fluid that is allowed to pass through the flow regulating valve 200) of the flow regulating valve 200, and the pressure sensor 500 has a faster response speed than the flow sensor 400 (that is, the pressure of the fluid detected by the pressure sensor 500 can be quickly changed in response to a change of the opening degree of the flow regulating valve 200).

Based on the above, after receiving the target flow value, the control module 300 first enters the pressure feedback regulation mode to perform quick coarse regulation (i.e., to perform pressure feedback regulation) on the opening degree of the flow regulating valve 200 according to the fluid pressure value detected by the pressure sensor 500, so as to make the opening degree of the flow regulating valve 200 quickly approach a target opening degree (i.e., an opening degree of the flow regulating valve 200 when the opening degree of the flow regulating valve 200 is finally stable) corresponding to the target flow value. After the fluid flow value detected by the flow sensor 400 is stable (i.e., meeting the first stabilization condition), the control module 300 enters the flow feedback regulation mode to perform high-precision regulation (i.e., to perform flow feedback regulation) on the opening degree of the flow regulating valve 200 according to the fluid flow value detected by the flow sensor 400, so as to precisely regulate the opening degree of the flow regulating valve 200 to the target opening degree.

The mass flow controller provided by the present disclosure combines the pressure feedback regulation mode with a high response speed and the flow feedback regulation mode with high precision, that is, when the variation amount of the target flow value exceeds the preset threshold, the pressure feedback regulation mode is firstly entered, the opening degree of the flow regulating valve is quickly made to approach the target opening degree through the pressure feedback regulation, then the pressure feedback regulation mode is switched to the flow feedback regulation mode, and the opening degree of the flow regulating valve is precisely regulated through the flow feedback regulation. Compared with an existing method of only adopting the flow feedback regulation mode, the combination of the pressure feedback regulation mode and the flow feedback regulation mode can shorten regulation time for making the opening degree of the flow regulating valve gradually approach to the target opening degree, so that a response speed of the mass flow controller can be increased while precision of fluid flow regulation is ensured, thereby improving a process effect and machine capacity of semiconductor processes.

As shown in FIG. 3, the control module 300 is configured to receive a target flow signal and determine a current target flow value of the mass flow controller according to the received target flow signal. A criterion for determining whether the variation amount of the target flow value exceeds the preset threshold is not specifically limited in the embodiments of the present disclosure. For example, in order to meet a requirement that a measurement range of the mass flow controller be changed for a plurality of times in the semiconductor processes, the variation amount of the target flow value preferably refers to a difference between a currently received target flow value and a previous target flow value. The variation amount of the target flow value exceeding the preset threshold refers to: the difference between the currently received target flow value and the previous target flow value is greater than the preset threshold.

The magnitude of the preset threshold is not specifically limited in the embodiments of the present disclosure, and the preset threshold may be determined according to actual efficiency of the flow feedback regulation, that is, when the flow feedback regulation mode is adopted, that is, when the opening degree of the flow regulating valve 200 is regulated according to the fluid flow value detected by the flow sensor 400, if the time required for making the fluid flow value reach the new target flow value is within an acceptable range, the flow feedback regulation mode may be directly adopted for the regulation, without first adopting the pressure feedback regulation mode to regulate the opening degree of the flow regulating valve.

Specifically, as shown in FIG. 3, the control module 300 is further configured to: when the variation amount of the target flow value does not exceed the preset threshold, enter the flow feedback regulation mode, that is, perform the calculation according to the fluid flow value detected by the flow sensor 400 and the target flow value to obtain the opening regulation amount of the flow regulating valve 200, and regulate the opening degree of the flow regulating valve 200 according to the opening regulation amount (i.e., skipping the step S10 and directly performing the step S20).

A structure which forms the fluid passage is not specifically limited in the embodiments of the present disclosure. For example, optionally, as shown in FIG. 1, the mass flow controller may include a fluid-guide structure 100 having the fluid passage formed therein, and the flow regulating valve 200, the control module 300, the flow sensor 400, and the pressure sensor 500 are all connected to the fluid-guide structure 100.

How the flow sensor 400 is connected to the fluid-guide structure 100 is not specifically limited in the embodiments of the present application. For example, optionally, as shown in FIG. 1, the fluid-guide structure 100 is provided with two branch openings (a first branch opening 111 and a second branch opening 112) that are communicated with the fluid passage, the two branch openings are located between the inlet and the flow regulating valve 200 and spaced apart along an extending direction of the fluid passage; the flow sensor 400 is provided with a sensing tube 410, two ends of the sensing tube 410 are respectively communicated with the two branch openings, and the flow sensor 400 is configured to detect a flow value of a fluid in the sensing tube 410 (a flow rate of the fluid in the sensing tube 410 is the same as that of the fluid in the fluid passage connected in parallel with the sensing tube 410, so that the flow value of the fluid passing through the flow regulating valve 200 can be determined based on the flow value of the fluid in the sensing tube 410).

A structure of the fluid-guide structure 100 is not specifically limited in the embodiments of the present disclosure. For example, optionally, as shown in FIG. 1, the fluid-guide structure 100 includes a base, a flow divider 110 fixed on the base, an inlet connector 120, and an outlet connector 130, a first end of the inlet connector 120 is formed as the inlet of the fluid passage, a second end of the inlet connector 120 is communicated with a first end of the flow divider 110, a second end of the flow divider 110 is communicated with one end of the flow regulating valve 200, the other end of the flow regulating valve 200 is communicated with a first end of the outlet connector 130, and a second end of the outlet connector 130 is formed as the outlet of the fluid passage. The flow divider 110 is provided with the two branch openings (the first branch opening 111 and the second branch opening 112) communicated with an internal cavity of the flow divider 110.

A path along which the fluid flows through the mass flow controller is shown by the arrows in FIG. 1. The fluid enters the fluid passage from the first end (the inlet) of the inlet connector 120, and a branch of the fluid is separated from the fluid when the fluid flows through the flow divider 110 and flows through the sensing tube 410, a flow rate of the branch of the fluid in the sensing tube 410 is the same as that of the fluid in a branch connected in parallel with the sensing tube 410 (that is, the fluid flow value detected by the flow sensor 400 is directly proportional to the fluid flow value of the fluid passage). Then, the fluid flows into the flow regulating valve 200 from the second end of the flow divider 110, the flow regulating valve 200 controls the flow of the fluid in the fluid passage, and finally the fluid is discharged from the outlet through the outlet connector 130.

How the flow sensor 400 detects a flow of the fluid in the sensing tube 410 is not specifically limited in the embodiments of the present disclosure. For example, in a case where the flow sensor 400 is a thermal flowmeter, the flow sensor 400 includes two temperature sensors respectively disposed at two different positions on the sensing tube 410, the flow sensor 400 performs a calculation according to fluid temperatures at the two different positions on the sensing tube 410 respectively detected by the two temperature sensors to obtain a temperature difference between the two fluid temperatures, and obtains the flow value of the fluid in the sensing tube 410 (i.e., the fluid flow value detected by the flow sensor 400) according to the temperature difference.

The embodiments of the present disclosure do not specifically limit how the control module 300 regulates the opening degree of the flow regulating valve 200 with a PID closed-loop control method according to the fluid pressure value detected by the pressure sensor 500 downstream of the flow regulating valve 200. For example, as an alternative implementation of the present disclosure, as shown in FIG.

5, the control module 300 is specifically configured to perform the following operations in the pressure feedback regulation mode.

In step S11, the control module 300 determines the corresponding target pressure value of the pressure sensor 500 according to the target flow value.

The control module 300 performs step S12 and step S13 cyclically, during which the control module 300 acquires, periodically or in real time, the fluid pressure value detected by the pressure sensor 500, performs a PID calculation on the fluid pressure value detected by the pressure sensor 500 and the target pressure value to obtain the opening regulation amount of the flow regulating valve 200, and regulates the opening degree of the flow regulating valve 200 according to the opening regulation amount. By continuously performing the PID calculation and regulating the opening degree of the flow regulating valve 200, an absolute value of a pressure difference between the fluid pressure value detected by the pressure sensor 500 and the target pressure value may be gradually reduced. When the fluid pressure value detected by the pressure sensor 500 is gradually stabilized at the target pressure value, that is, when the fluid flow value detected by the flow sensor 400 meets the first stabilization condition, the control module 300 stops the above cycle, and enters the flow feedback regulation mode (that is, performing the step S20). The opening regulation amount is positively correlated with the pressure difference.

Figure 6:
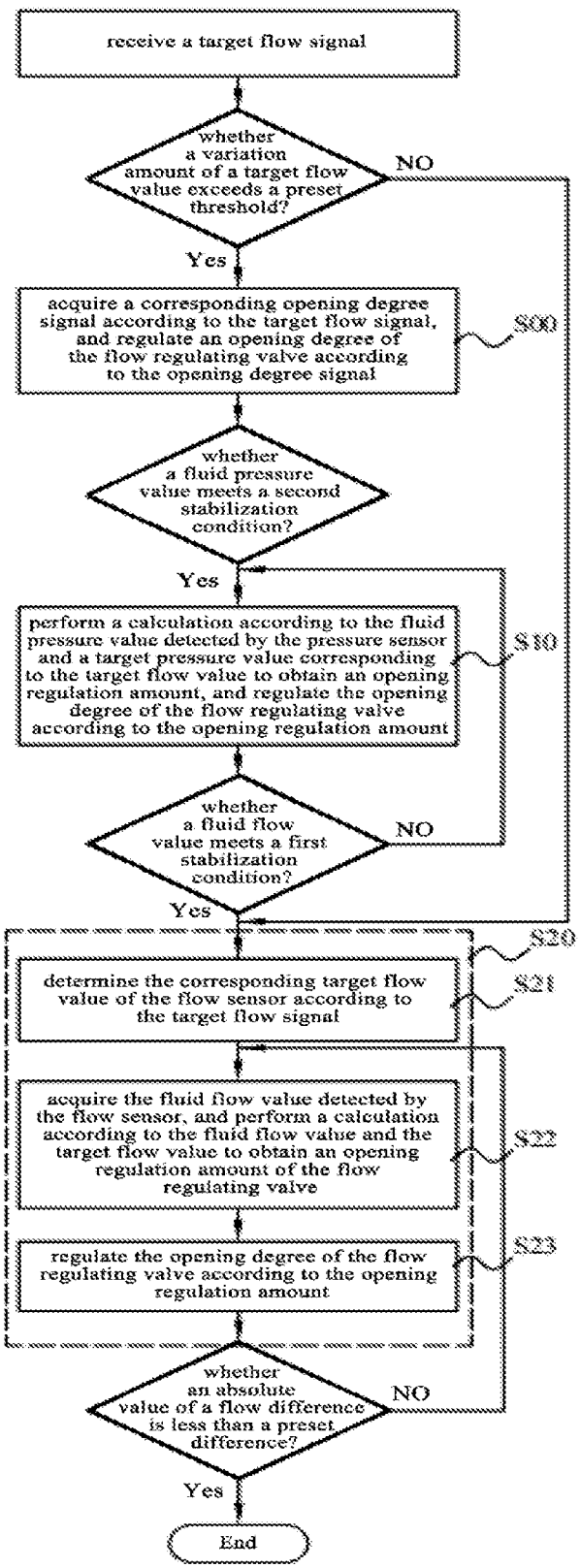
FIG. 6 is a flowchart of a flow control method according to another embodiment of the present disclosure.

The embodiments of the present disclosure do not specifically limit how the control module 300 performs PID regulation on the opening degree of the flow regulating valve 200 according to the fluid flow value detected by the flow sensor 400 upstream of the flow regulating valve 200. For example, as an alternative implementation of the present disclosure, as shown in FIG. 6 and FIG. 7, the control module 300 is specifically configured to perform the following operations.

In step S21, the control module 300 determines the corresponding target flow value of the flow sensor 400 according to the received target flow signal.

The control module 300 performs step S22 and step S23 cyclically, during which the control module 300 acquires, periodically or in real time, the fluid flow value detected by the flow sensor 400, and performs a PID calculation on the fluid flow value detected by the flow sensor 400 and the target flow value to obtain the opening regulation amount of the flow regulating valve 200. By continuously performing the PID calculation and regulating the opening degree of the flow regulating valve 200, an absolute value of a flow difference between the fluid flow value detected by the flow sensor 400 and the target flow value may be gradually reduced. When the absolute value of the flow difference is less than a preset difference, the control module 300 stops the above cycle, and the process is ended. An absolute value of the opening regulation amount is positively correlated with the absolute value of the flow difference.

Figure 7:
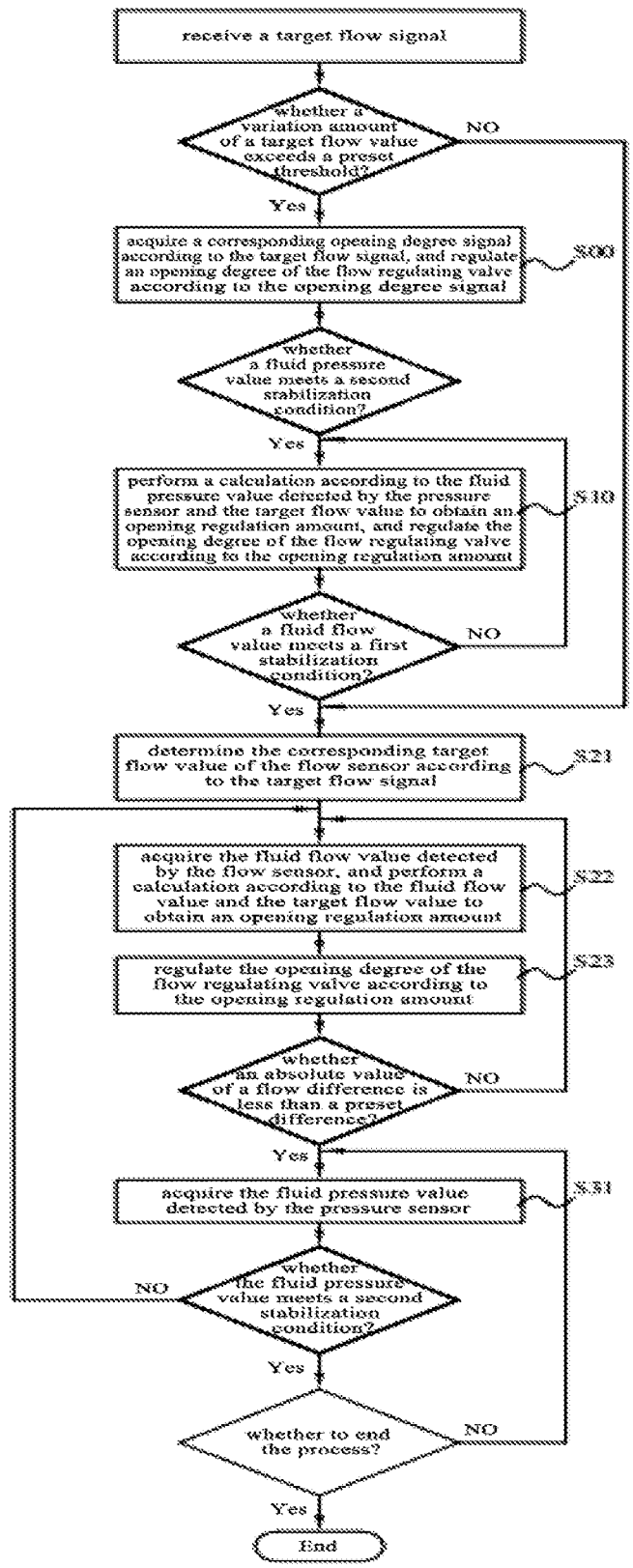
FIG. 7 is a flowchart of a flow control method according to another embodiment of the present disclosure.

In order to further improve the precision of the mass flow controller in controlling the fluid flow, as a preferred implementation of the present disclosure, as shown in FIG. 7, the control module 300 is further configured to perform the following operations.

After the absolute value of the flow difference is less than the preset difference, the control module 300 acquires, periodically or in real time, the fluid pressure value detected by the pressure sensor 500 (performing step S31), and determines whether the fluid pressure value detected by the pressure sensor 500 meets a second stabilization condition.

When the fluid pressure value detected by the pressure sensor does not meet the second stabilization condition, the control module 300 enters the flow feedback regulation mode again.

As shown in FIG. 1, the pressure sensor 500 is directly connected to a device downstream of the mass flow controller through the outlet of the fluid passage. When the device downstream of the mass flow controller fails or a gas path is blocked, a pressure fluctuation occurs in the gas path downstream of the flow regulating valve 200. In the embodiments of the present disclosure, after regulating the opening degree of the flow regulating valve 200 in the flow feedback regulation mode to the target opening degree, the control module 300 further continues to monitor a downstream fluid pressure through the pressure sensor 500; and when a fluctuation of the downstream fluid pressure occurs, the control module 300 regulates the opening degree of the flow regulating valve 200 again in the flow feedback regulation mode again to counteract a flow fluctuation possibly caused by the fluctuation of the pressure, so as to prevent the flow from being changed due to the downstream abnormal conditions.

In the embodiments of the present disclosure, the pressure sensor 500 is not only configured to complete the coarse regulation of the opening degree of the flow regulating valve during the pressure feedback regulation, but is also configured to monitor downstream situations with the characteristic of quick response of the pressure sensor 500 after the flow feedback regulation is performed, thereby further improving the precision of the mass flow controller in controlling the fluid flow.

Figure 4:
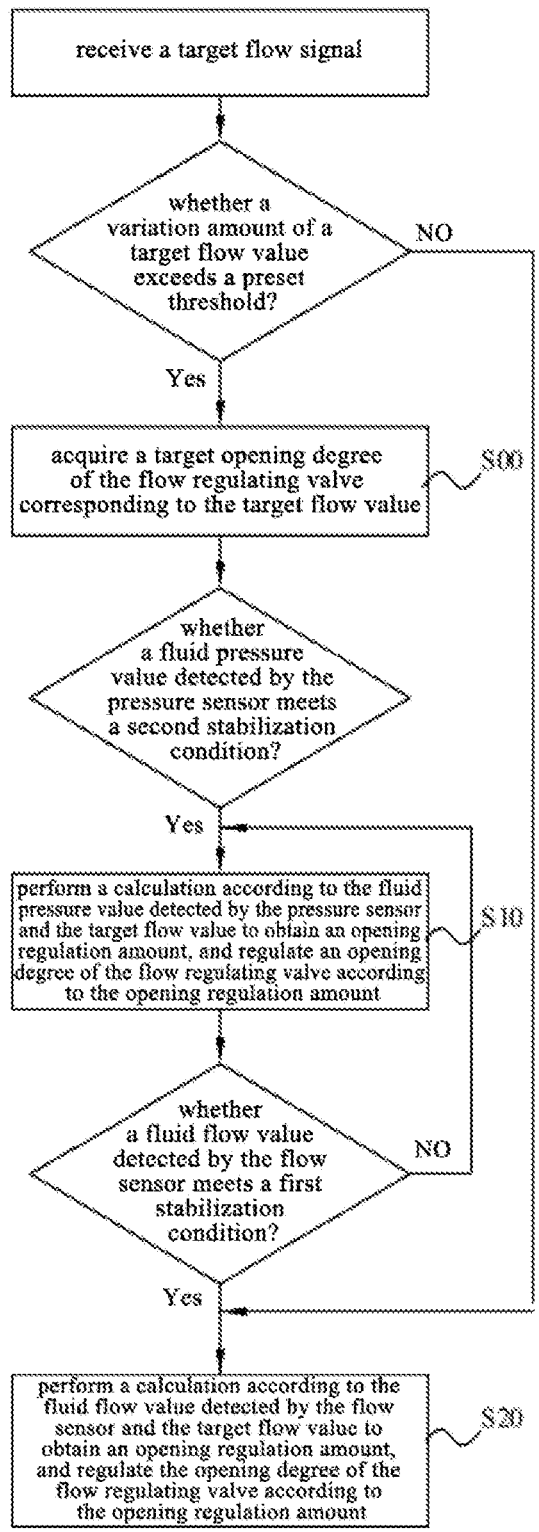
FIG. 4 is a flowchart of a flow control method according to another embodiment of the present disclosure.
Figure 5:
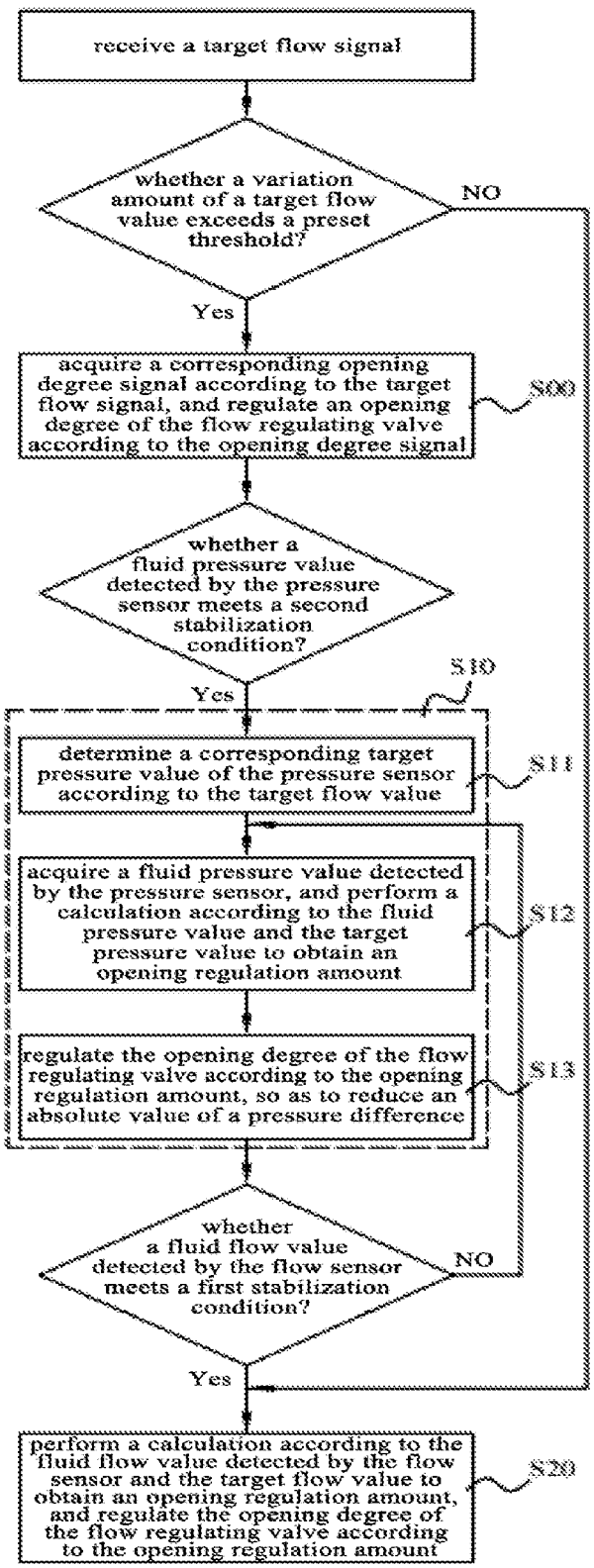
FIG. 5 is a flowchart of a flow control method according to another embodiment of the present disclosure.

In order to further increase the efficiency of the mass flow controller in regulating the fluid flow, preferably, as shown in FIG. 4 to FIG. 6, the control module 300 is further configured to acquire the target opening degree of the flow regulating valve corresponding to the target flow value before entering the pressure feedback regulation mode (i.e., performing step S00), and enter the pressure feedback regulation mode after the fluid pressure value detected by the pressure sensor meets the second stabilization condition (i.e., after the opening degree of the flow regulating valve 200 is stabilized around the target opening degree of the flow regulating valve).

In the embodiments of the present disclosure, the control module 300 first obtains the corresponding target opening degree of the flow regulating valve according to the target flow value, and regulates the opening degree of the flow regulating valve 200 according to the target opening degree, so as to make the opening degree of the flow regulating valve 200 quickly approach the target opening degree in an open-loop control manner, which, compared with directly using the pressure feedback regulation (the closed-loop control) to change the opening degree of the flow regulating valve 200 to be close to the target opening degree, can save regulation time, thereby further increasing the efficiency of the mass flow controller in regulating the fluid flow.

The target opening degree of the flow regulating valve is set in advance, for example, the target opening degree of the flow regulating valve may be stored in the control module 300 in advance.

It should be noted that the first stabilization condition and the second stabilization condition are respectively used for determining whether a pressure signal and a flow signal are stable, for example, the first stabilization condition or the second stabilization condition may be that whether a difference between a maximum value of the signal and a minimum value of the signal in a fluctuation range during a latest preset time is within a preset difference range. Specifically, the first stabilization condition may be: a difference between a maximum value and a minimum value among all the fluid flow values detected by the flow sensor during a first preset time is less than or equal to a first preset difference; and the second stabilization condition may be: a difference between a maximum value and a minimum value among all the fluid pressure values detected by the pressure sensor during a second preset time is less than or equal to a second preset difference.

A type of a structure of the flow regulating valve 200 is not specifically limited in the embodiments of the present disclosure. For example, the flow regulating valve 200 may be a solenoid valve or a piezoelectric valve, and the magnitude of the opening degree of the flow regulating valve corresponds to the magnitude of an electrical signal (e.g., a valve voltage).

Figure 2:
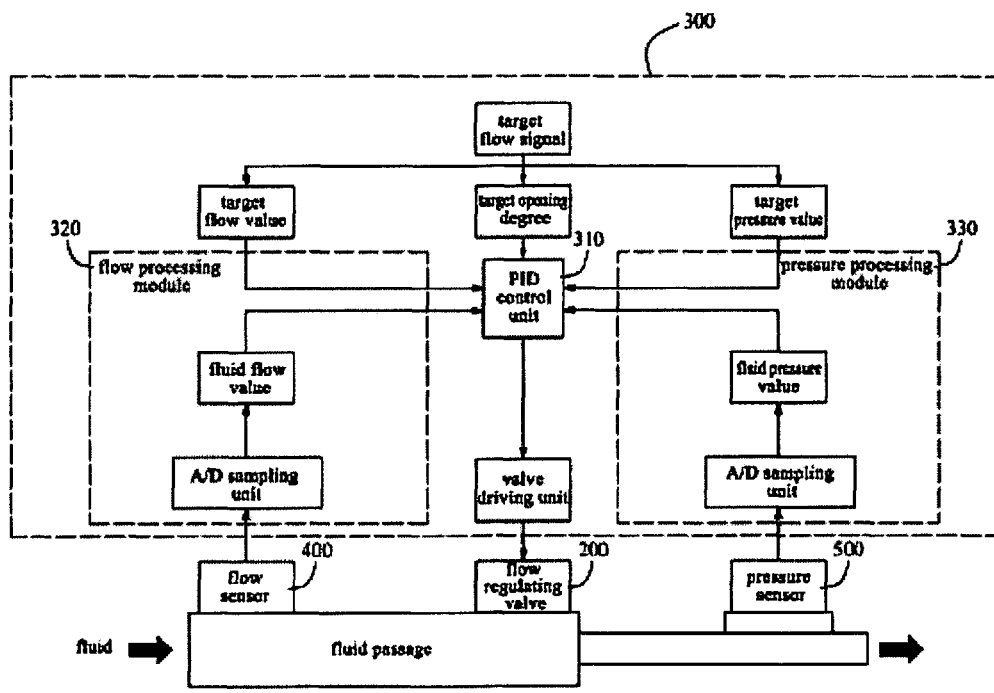
FIG. 2 is a schematic diagram illustrating a functional structure of a control module in a mass flow controller according to an embodiment of the present disclosure.

The embodiments of the present disclosure do not specifically limit a structure of the control module 300 and how the control module 300 is connected to the flow regulating valve 200, the flow sensor 400, and the pressure sensor 500. For example, optionally, as shown in FIG. 2, the control module 300 includes a PID control unit 310, a flow processing module 320, and a pressure processing module 330. The pressure processing module 330 is configured to acquire the fluid pressure value detected by the pressure sensor 500, process the fluid pressure value, and send the processed fluid pressure value to the PID control unit 310, so as to allow the PID control unit 310 to perform corresponding calculation processing on a processed signal; similarly, the flow processing module 320 is configured to acquire the fluid flow value detected by the flow sensor 400, process the fluid flow value, and send the processed fluid flow value to the PID control unit 310; and the PID control unit 310 is configured to regulate, before the pressure feedback regulation mode is entered, the opening degree of the flow regulating valve 200 in the open-loop control manner according to the determined target opening degree of the flow regulating valve corresponding to the target flow value, to regulate, in the pressure feedback regulation mode, the opening degree of the flow regulating valve 200 in the PID closed-loop control manner according to the fluid pressure value provided by the pressure processing module 330 and the target pressure value, and to regulate, in the flow feedback regulation mode, the opening degree of the flow regulating valve 200 in the PID closed-loop control manner according to the fluid flow value provided by the flow processing module 320 and the target flow value.

Alternatively, as shown in FIG. 2, the flow processing module 320 and the pressure processing module 330 are respectively connected to the corresponding flow sensor 400 and the corresponding pressure sensor 500 through respective A/D sampling units, and the A/D sampling units are configured to convert analog signals from detection devices (the flow sensor 400 and the pressure sensor 500) into digital signals, so that the PID control unit 310 can perform calculation and analysis of data. The PID control unit 310 is connected to the flow regulating valve 200 through a valve driving unit, and the valve driving unit is configured to output a corresponding valve voltage to the flow regulating valve 200 according to a signal sent by the PID control unit 310, so as to change the opening degree of the flow regulating valve 200, thereby achieving the regulation of the fluid flow of the mass flow controller.

Figure 8:
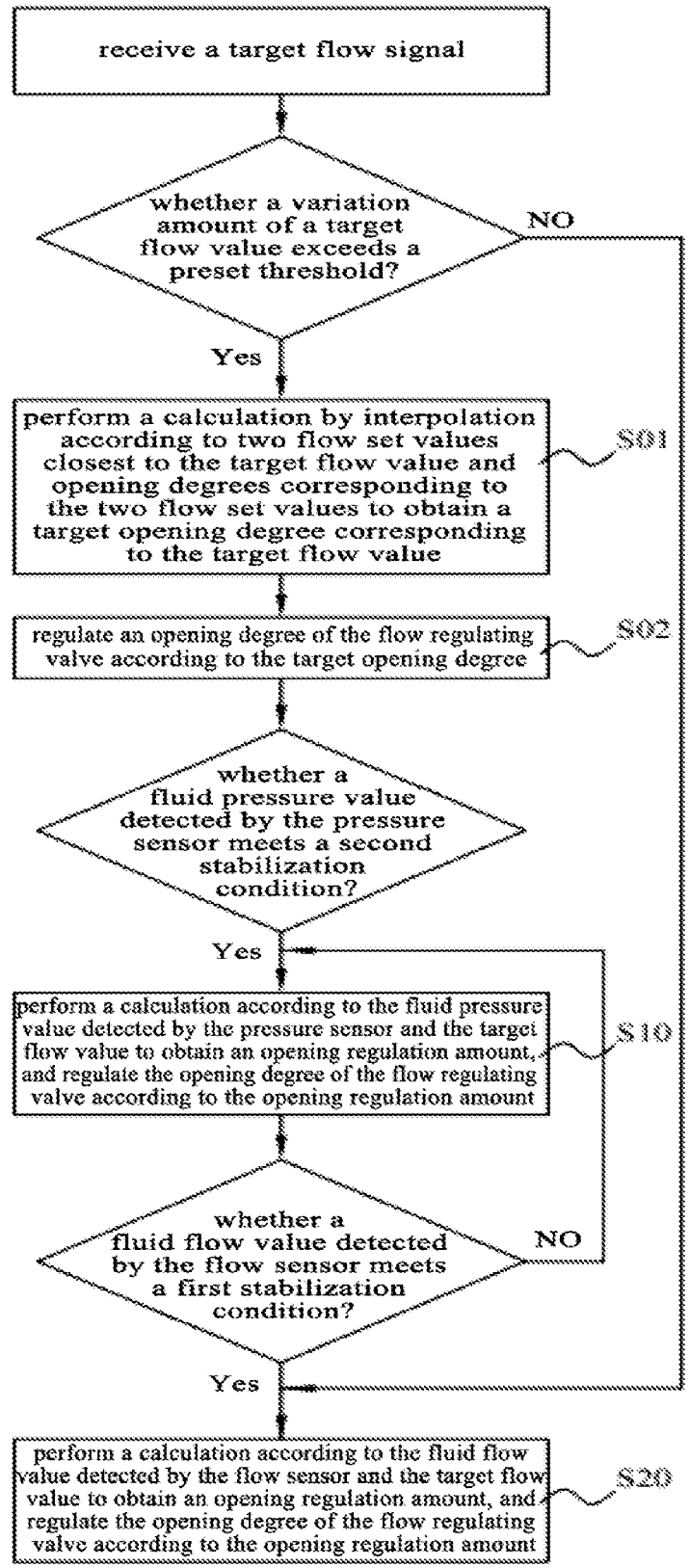
FIG. 8 is a flowchart of a flow control method according to another embodiment of the present disclosure.

The embodiments of the present disclosure do not specifically limit how the control module 300 determines the target opening degree of the flow regulating valve according to the target flow signal. For example, preferably, a plurality of flow set values and target opening degrees of the flow regulating valve respectively corresponding to the plurality of flow set values are stored in the control module 300; and as shown in FIG. 8, the control module 300 is configured to perform a calculation by interpolation according to two flow set values closest to the target flow value and the opening degrees corresponding to the two flow set values to obtain the target opening degree corresponding to the target flow value.

As shown in FIG. 1, during a semiconductor process, taking the fluid being a gas as an example, a vacuum pump 600 downstream of the outlet pumps the gas during the whole process, so as to ensure that a pressure at the outlet of the mass flow controller downstream of the flow regulating valve 200 reaches or approaches a vacuum state before the mass flow controller starts to be used. When an outlet pressure of the mass flow controller is much lower than an inlet pressure of the mass flow controller, a flow of the fluid passing through a valve port of the flow regulating valve 200 is directly proportional to the inlet pressure and an flow area of the flow regulating valve 200, i.e., $F \propto P^*A$, where F is the flow of the fluid passing through the mass flow controller, P is the inlet pressure, and A is the flow area of the flow regulating valve 200 (i.e., the opening degree of the flow regulating valve). When the inlet pressure P is constant, the flow F of the fluid passing through the mass flow controller can be changed by changing the flow area A of the flow regulating valve 200 (i.e., the opening degree of the flow regulating valve 200). In practical application, in a case where the fluid is a liquid, a suction pump may be provided downstream of the outlet to pump the liquid.

Figure 10:
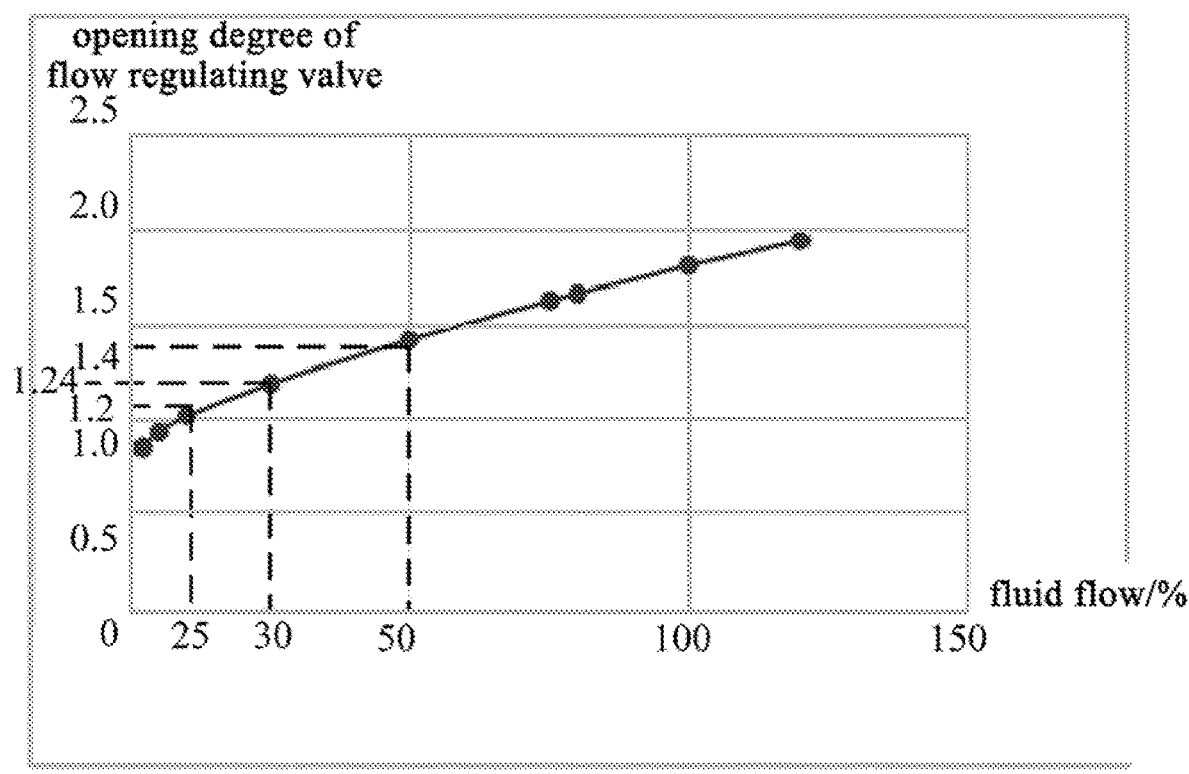
FIG. 10 is a graph schematically illustrating a correspondence between flow set values and opening degrees of a flow regulating valve stored in a control module in a mass flow controller according to an embodiment of the present disclosure.

When the inlet pressure is constant, the opening degree of the flow regulating valve 200 is positively correlated with the flow of the fluid (the curve shown in FIG. 10 is a curve illustrating a relationship between the opening degree of the flow regulating valve and the flow of the fluid, and the opening degrees of the flow regulating valve shown in FIG. 10 are dimensionless values and only illustrate a proportional relationship between the ordinates of the points). Since an opening degree of the solenoid valve is directly controlled by a valve voltage, the higher the valve voltage is, the larger the opening degree of the flow regulating valve is within a variable range of the opening degree of the flow regulating valve.

In the embodiments of the present disclosure, the control module 300 may perform a calculation by interpolation according to the two flow set values closest to the target flow value and the opening degrees corresponding to the two flow set values to obtain the target opening degree corresponding to the target flow value, and the target opening degree may be stored in the control module 300 in advance. When the control of the flow is performed, the control module 300 may call the target opening degree corresponding to the target flow value, and regulate the opening degree of the flow regulating valve in the open-loop control manner, so that the flow regulating valve can quickly reach a state close to the target opening degree, thereby saving the regulation time and increasing regulation efficiency.

For example, a plurality of black dots on the curve in FIG. 10 respectively indicate a plurality of flow set values and the opening degrees of the flow regulating valve respectively corresponding to the plurality of flow set values. In a case where the target flow value is 30% (i.e., 30% of a full measurement range of the mass flow controller), a calculation is performed by interpolation according to the coordinates (25%, 1.2) and (50%, 1.4) of two adjacent flow set values closest to 30%, obtaining that an ordinate of a point having the abscissa of 30% on a curve between the two adjacent flow set values is 1.24 that is the target opening degree corresponding to 30%. The obtained target opening degree may be stored in advance, and can be directly called before the pressure feedback regulation mode is entered, so as to regulate the opening degree of the flow regulating valve 200 to 1.24 in the open-loop control manner, thereby reducing a regulation amount in the subsequent pressure feedback regulation mode and increasing the regulation efficiency.

In a case where the flow regulating valve 200 is the solenoid valve, due to the characteristic of magnetic hysteresis of the solenoid valve, when the mass flow controller is controlled to be regulated to a same target flow value from different fluid flow values, the opening degree (the valve voltage) of the solenoid valve when the fluid flow is increased from a lower value to the target flow value is different the opening degree (the valve voltage) of the solenoid valve when the fluid flow is decreased from a higher value to the target flow value.

In order to further increase the flow regulation efficiency, the opening degrees corresponding to each flow set value preferably include an up opening degree (i.e., an opening degree corresponding to a case where the flow is increased from a lower value to the flow set value) and a down opening degree (i.e., an opening degree corresponding to a case where the flow is decreased from a higher value to the flow set value).

Specifically, as shown in Table 1-1 below, each up opening degree corresponds to an up valve voltage Uu, each down opening degree corresponds to a down valve voltage Ud, values of the up valve voltages corresponding to calibrated flow set values S1, S2, S3 ... Sn are Uu_1, Uu_2, Uu_3 ... Uu_n respectively, and values of the down valve voltages corresponding to the flow set values S1, S2, S3 ... Sn are Ud_1, Ud_2, Ud_3 ... and Ud_n respectively. The control module 300 may store two sets of calibrated data of increase and decrease of the flow as data templates of the valve voltages, so as to facilitate subsequent calling and calculation.

TABLE 1-1

Valve Voltage Values Corresponding to Multiple Flow Set Values

| | S1 | S2 | S3 | ... | Sn |
|---|---|---|---|---|---|
| Flow up valve voltage (up) | Uu_1 | Uu_2 | Uu_3 | ... | Uu_n |
| Flow down valve voltage (down) | Ud_1 | Ud_2 | Ud_3 | ... | Ud_n |

Figure 9:
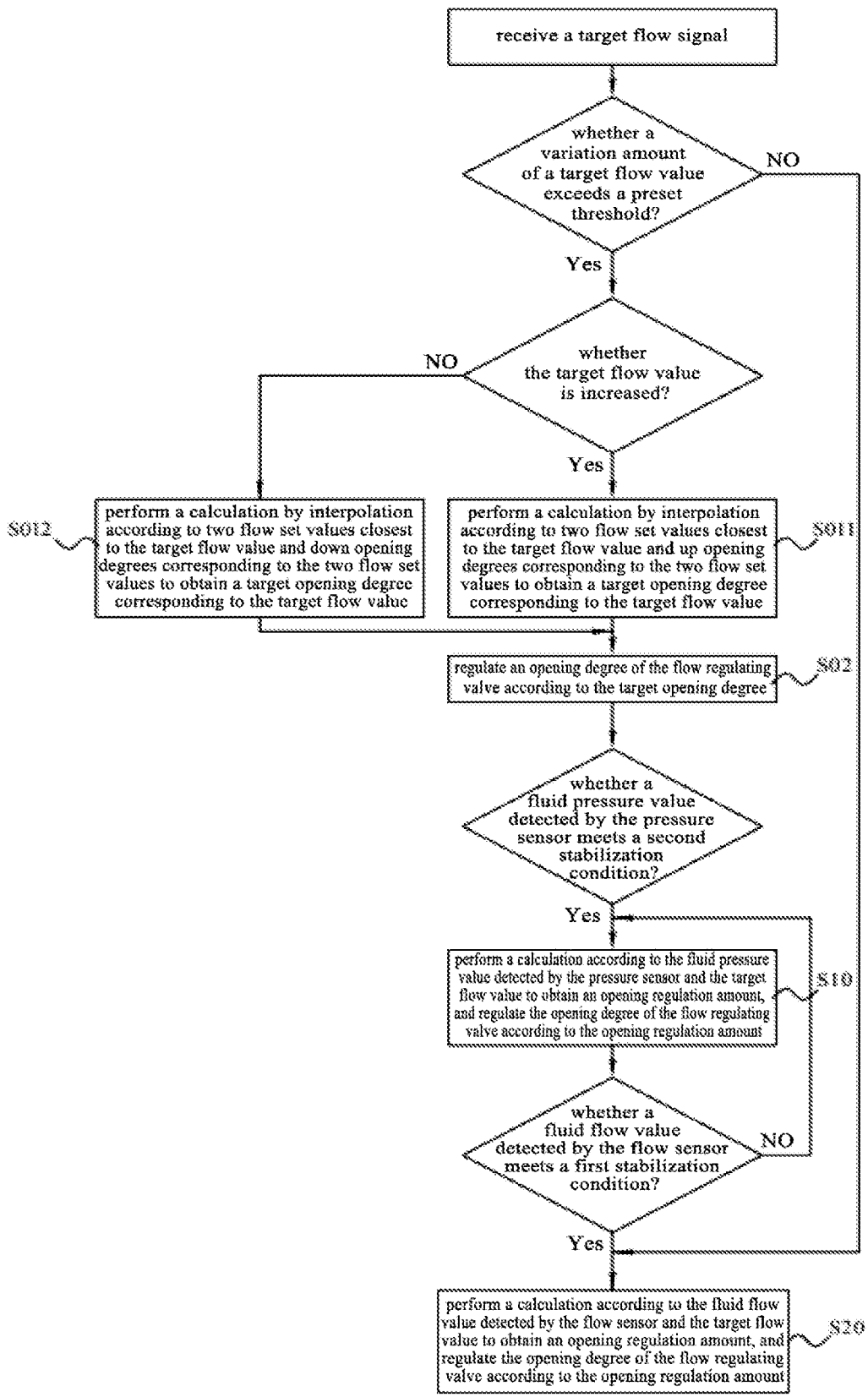
FIG. 9 is a flowchart of a flow control method according to another embodiment of the present disclosure.

Correspondingly, as shown in FIG. 9, step S01 of obtaining the corresponding target opening degree of the flow regulating valve according to the target flow value includes: in a case where the target flow value is increased, performing a calculation by interpolation according to two flow set values closest to the target flow value and the up opening degrees corresponding to the two flow set values to obtain the target opening degree (a valve voltage) corresponding to the target flow value, that is, performing step S011; and in a case where the target flow value is decreased, performing a calculation by interpolation according to two flow set values closest to the target flow value and the down opening degrees corresponding to the two flow set values to obtain the target opening degree (the valve voltage) corresponding to the target flow value, that is, performing step S012.

For example, in a case where the current target flow value Si is in an interval of [S(n-1), Sn] (that is, the two flow set values closest to Si are Sn-1 and Sn) and is greater than the previous target flow value, the coordinates (S(n-1), Uu_(n-1)) and (Sn, Uu_n) corresponding to the two flow set values closest to the current target flow value Si and the up opening degrees may be determined according to the information stored in the control module 300, and then a calculation may be performed by interpolation to obtain an ordinate (i.e., the target opening degree) of a point corresponding to the target flow value Si on a curve between (S(n-1), Uu_(n-1)) and (Sn, Uu_n).

Specifically, as can be known from the coordinates (S(n-1), Uu_(n-1)) and (Sn, Uu_n) corresponding to the two flow set values and the up opening degrees, a slope of the curve between the two flow set values is (Uu_n-Uu_(n-1))/(Sn-Sn-1), then a difference between the ordinate of (S(n-1), Uu_(n-1)) or (Sn, Uu_n) and the target opening degree may be determined based on a difference between the abscissa of (S(n-1), Uu_(n-1)) or (Sn, Uu_n) and the target flow value Si. For example, in a case where the difference between the target flow value Si and the abscissa S(n-1) of (S(n-1), Uu_(n-1)) is (Si-S(n-1)), then the difference between the target opening degree and the ordinate Uu_(n-1) of (S(n-1), Uu_(n-1)) is a product of the difference between the target flow value Si and the abscissa and the slope of the curve between the two flow set values, i.e., (Si-S(n-1))(Uu_n-Uu_(n-1))/(Sn-Sn-1), then it may be determined that the target opening degree is the sum of the ordinate Uu_(n-1) of (S(n-1), Uu_(n-1)) and the difference between the ordinate and the target opening degree, that is, in the case where the target flow value Si is greater than the previous target flow value, the corresponding target opening degree is (Si-S(n-1))(Uu_n-Uu_(n-1))/(Sn-Sn-1)+Uu_(n-1).

Similarly, in a case where the current target flow value Si is in the interval of [S(n-1), Sn] and is less than the previous target flow value, the coordinates (S(n-1), Ud_(n-1)) and (Sn, Ud_n) corresponding to the two flow set values closest to the current target flow value Si and the corresponding down opening degrees may be determined according to the information stored in the control module 300, and then a calculation may be performed by interpolation to obtain an ordinate (i.e., the target opening degree) of a point corresponding to the target flow value Si on a curve between (S(n-1), Ud_(n-1)) and (Sn, Ud_n).

Specifically, as can be known from the coordinates (S(n-1), Ud_(n-1)) and (Sn, Ud_n) corresponding to the two flow set values and the down opening degrees, a slope of the curve between the two flow set values is (Ud_n-Ud_(n-1))/(Sn-Sn-1), and then a difference between the ordinate of (S(n-1), Ud_(n-1)) or (Sn, Ud_n) and the target opening degree may be determined based on a difference between the abscissa of (S(n-1), Ud_(n-1)) or (Sn, Ud_n) and the target flow value Si. For example, in a case where the difference between the target flow value Si and the abscissa S(n-1) of (S(n-1), Ud_(n-1)) is (Si-S(n-1)), then the difference between the target opening degree and the ordinate Ud_(n-1) of (S(n-1), Ud_(n-1)) is a product of the difference between the target flow value Si and the abscissa and the slope of the curve between the two flow set values, i.e., (Si-S(n-1))(Ud_n-Ud_(n-1))/(Sn-Sn-1), and then it may be determined that the target opening degree is the sum of the ordinate Ud_(n-1) of (S(n-1), Ud_(n-1)) and the difference between the ordinate and the target opening degree, that is, in the case where the target flow value Si is less than the previous target flow value, the corresponding target opening degree is (Si-S(n-1))(Ud_n-Ud_(n-1))/(Sn-Sn-1)+Ud_(n-1).

In the embodiments of the present disclosure, the opening degrees corresponding to each flow set value stored in the control module 300 include the up opening degree and the down opening degree. Thus, in the case where the flow regulating valve 200 is the solenoid valve, the increase and decrease of the opening degree of the flow regulating valve can be determined according to the increase and decrease of the target flow value, and then an appropriate set of data can be selected from the up opening degree and the down opening degree for performing the open-loop control, so that the opening degree of the flow regulating valve can quickly approach the target opening degree, which reduces the regulation amount in the subsequent pressure feedback regulation and increases the regulation efficiency of the fluid flow.

In order to facilitate an understanding of those of ordinary skill in the art, the present disclosure further provides a specific embodiment of a process of regulating the fluid flow of the mass flow controller with the control module 300 shown in FIG. 2.

When the variation amount of the target flow value is greater than the preset threshold, the control module 300 determines the target opening degree corresponding to the input target flow value, the target flow value, and the target pressure value according to the pre-stored templates.

The control module 300 first enters the open-loop control mode, and the PID control unit 310 controls the valve driving unit to apply a corresponding valve voltage to the flow regulating valve 200 according to the target opening degree corresponding to the target flow value. Meanwhile, the pressure sensor 500 continuously detects a downstream fluid pressure value, and transmits the downstream fluid pressure value to the PID control unit 310 after the A/D sampling unit in the pressure processing module 330 performs analog-to-digital conversion on the downstream fluid pressure value.

After the fluid pressure value detected by the pressure sensor 500 is stable (meeting the second stabilization condition)(that is, after the opening degree of the flow regulating valve is stabilized at an opening degree corresponding to the target opening degree), the control module 300 is switched to the pressure feedback regulation mode, the pressure sensor 500 periodically feeds the downstream fluid pressure value back to the PID control unit 310 through the pressure processing module 330, and the PID control unit 310 periodically changes the opening degree of the flow regulating valve 200 with the PID control method according to the fluid pressure value and the target pressure value, so as to reduce the pressure difference between the fluid pressure value and the target pressure value.

When the fluid flow value detected by the flow sensor 400 tends to be stable (meeting the first stabilization condition), the control module 300 is switched to the flow feedback regulation mode (since the downstream fluid pressure varies largely, it is not necessary to wait for the stabilization of the fluid pressure value detected by the pressure sensor 500 in order to save the regulation time), the flow sensor 400 feeds the detected fluid flow value back to the PID control unit 310 through the flow processing module 320, and the PID control unit 310 periodically changes the opening degree of the flow regulating valve 200 with the PID control method according to the fluid flow value and the target flow value, so as to reduce the flow difference between the fluid flow value and the target flow value until the absolute value of the flow difference is less than the preset difference.

Then, the control module 300 continues to monitor the fluid pressure value through the pressure sensor 500 at the background. Once an abnormal pressure fluctuation occurs at the downstream, the abnormal pressure fluctuation may be fed back to the control module 300 through the pressure sensor 500, so the control module 300 may be switched to the flow feedback regulation mode again to compensate for the valve voltage in time, so as to counteract the flow fluctuation possibly caused by the pressure fluctuation, and ensure stability and precision of the fluid flow of the mass flow controller.

In a second aspect of the present disclosure, there is provided a flow control method of a mass flow controller, which is applied to the mass flow controller provided in the embodiments of the present disclosure. As shown in FIG. 3, the flow control method includes: entering a pressure feedback regulation mode when a variation amount of a target flow value exceeds a preset threshold, and in the pressure feedback regulation mode, performing a calculation according to a fluid pressure value detected by the pressure sensor and a target pressure value corresponding to the target flow value to obtain an opening regulation amount of the flow regulating valve, and regulating an opening degree of the flow regulating valve according to the opening regulation amount (i.e., performing step S10); and entering a flow feedback regulation mode after a fluid flow value detected by the flow sensor meets a first stabilization condition, and in the flow feedback regulation mode, performing a calculation according to the fluid flow value detected by the flow sensor and the target flow value to obtain an opening regulation amount of the flow regulating valve, and regulating the opening degree of the flow regulating valve according to the opening regulation amount (i.e., performing step S20).

Optionally, the preset threshold may be determined according to actual efficiency of the flow feedback regulation, that is, when the flow feedback regulation mode is adopted, that is, when the opening degree of the flow regulating valve is regulated according to the fluid flow value detected by the flow sensor, if the time required for making the fluid flow value reach the new target flow value is within an acceptable range, the flow feedback regulation mode may be directly adopted for the regulation, without first adopting the pressure feedback regulation mode to regulate the opening degree of the flow regulating valve. Specifically, as shown in FIG. 3, the flow control method further includes: when the variation amount of the target flow value does not exceed the preset threshold, entering the flow feedback regulation mode, that is, performing the calculation according to the fluid flow value detected by the flow sensor and the target flow value to obtain the opening regulation amount of the flow regulating valve, and regulating the opening degree of the flow regulating valve according to the opening regulation amount (i.e., skipping the step S10 and directly performing the step S20).

How to perform PID regulation on the opening degree of the flow regulating valve according to a downstream fluid pressure value relative to the flow regulating valve is not specifically limited in the embodiments of the present disclosure. For example, as an alternative implementation of the present disclosure, as shown in FIG. 5, the pressure feedback regulation (the step S10) specifically includes: in step S11, determining the corresponding target pressure value of the pressure sensor according to the target flow value; and performing step S12 and step S13 cyclically, during which the fluid pressure value detected by the pressure sensor is acquired periodically or in real time, a PID calculation is performed on the fluid pressure value detected by the pressure sensor and the target pressure value to obtain the opening regulation amount of the flow regulating valve, and the opening degree of the flow regulating valve is regulated according to the opening regulation amount. By continuously performing the PID calculation and regulating the opening degree of the flow regulating valve, an absolute value of a pressure difference between the fluid pressure value detected by the pressure sensor and the target pressure value may be gradually reduced. When the fluid pressure value detected by the pressure sensor is gradually stabilized at the target pressure value, that is, when the fluid flow value detected by the flow sensor meets the first stabilization condition, the above cycle is stopped, and the flow feedback regulation mode is entered (that is, performing the step S20). The opening regulation amount is positively correlated with the pressure difference.

How to perform the PID regulation on the opening degree of the flow regulating valve according to an upstream fluid flow value relative to the flow regulating valve is not specifically limited in the embodiments of the present disclosure. For example, as an alternative implementation of the present disclosure, as shown in FIG. 6 and FIG. 7, the flow feedback regulation (the step S20) specifically includes: in step S21, determining the corresponding target flow value of the flow sensor according to a received target flow signal; performing step S22 and step S23 cyclically, during which the fluid flow value detected by the flow sensor is acquired periodically or in real time, and a PID calculation is performed on the fluid flow value detected by the flow sensor and the target flow value to obtain the opening regulation amount of the flow regulating valve. By continuously performing the PID calculation and regulating the opening degree of the flow regulating valve, an absolute value of a flow difference between the fluid flow value detected by the flow sensor and the target flow value may be gradually reduced. When the absolute value of the flow difference is less than a preset difference, the above cycle is stopped, and the process is ended. An absolute value of the opening regulation amount is positively correlated with the absolute value of the flow difference.

In order to further improve the precision of the mass flow controller in controlling the fluid flow, as a preferred implementation of the present disclosure, as shown in FIG. 7, the flow control method further includes: after the absolute value of the flow difference is less than the preset difference, performing step S31 periodically or in real time to acquire the fluid pressure value detected by the pressure sensor, and determining whether the fluid pressure value detected by the pressure sensor meets a second stabilization condition; and when the fluid pressure value detected by the pressure sensor does not meet the second stabilization condition, entering the flow feedback regulation mode again.

In order to further increase the efficiency of the mass flow controller in regulating the fluid flow, preferably, as shown in FIG. 4 to FIG. 6, the flow control method further includes: performing, before entering the pressure feedback regulation mode (the step S10), step S00 of acquiring the target opening degree of the flow regulating valve corresponding to the target flow value, and entering, after the fluid pressure value detected by the pressure sensor meet the second stabilization condition (i.e., after the opening degree of the flow regulating valve is stabilized around the target opening degree of the flow regulating valve), the pressure feedback regulation mode (performing the step S10).

In order to further increase the flow regulation efficiency, preferably, a plurality of flow set values and target opening degrees of the flow regulating valve respectively corresponding to the plurality of flow set values are stored in the mass flow controller (the control module), and the flow control method further includes: in step S01, performing a calculation by interpolation according to two flow set values closest to the target flow value and the opening degrees corresponding to the two flow set values to obtain the target opening degree corresponding to the target flow value. (the step S00 is also included in step S02 of regulating the opening degree of the flow regulating valve according to the target opening degree of the flow regulating valve).

In a case where the flow regulating valve in the mass flow controller is a solenoid valve, in order to further increase the flow regulation efficiency, preferably, the opening degrees corresponding to each flow set value preferably include an up opening degree (i.e., an opening degree corresponding to a case where the flow is increased from a lower value to the flow set value) and a down opening degree (i.e., an opening degree corresponding to a case where the flow is decreased from a higher value to the flow set value), and the step S01 of obtaining the corresponding target opening degree of the flow regulating valve according to the target flow value includes: in a case where the target flow value is increased, performing a calculation by interpolation according to the two flow set values closest to the target flow value and the up opening degrees corresponding to the two flow set values to obtain the target opening degree (a valve voltage) corresponding to the target flow value; and in a case where the target flow value is decreased, performing a calculation by interpolation according to the two flow set values closest to the target flow value and the down opening degrees corresponding to the two flow set values to obtain the target opening degree (the valve voltage) corresponding to the target flow value.

The flow control method provided herein combines the pressure feedback regulation mode with a high response speed and the flow feedback regulation mode with high precision, that is, when the variation amount of the target flow value exceeds the preset threshold, the pressure feedback regulation mode is firstly entered, the opening degree of the flow regulating valve is quickly made to approach the target opening degree through the pressure feedback regulation, then the pressure feedback regulation mode is switched to the flow feedback regulation mode, and the opening degree of the flow regulating valve is precisely regulated through the flow feedback regulation. Compared with an existing method of only adopting the flow feedback regulation mode, the combination of the pressure feedback regulation mode and the flow feedback regulation mode can shorten regulation time for making the opening degree of the flow regulating valve gradually approach to the target opening degree, so that a response speed of the mass flow controller can be increased while precision of fluid flow regulation is ensured, thereby improving a process effect and machine capacity of semiconductor processes.

It should be understood that the above implementations are merely exemplary implementations adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A mass flow controller, with a fluid passage provided in the mass flow controller, and a valve connected between an inlet of the fluid passage and an outlet of the fluid passage, wherein the mass flow controller further comprises a control module, a flow sensor, and a pressure sensor, wherein
the flow sensor is disposed between the inlet and the valve, and is configured to detect a fluid flow of the fluid passage;
the pressure sensor is disposed at the outlet, and is configured to detect a fluid pressure of the fluid passage;
the control module is configured to enter a pressure feedback regulation mode in response to a variation amount of a target flow exceeding a preset threshold, and enter a flow feedback regulation mode after the fluid flow detected by the flow sensor meets a first stabilization condition, wherein
the control module is configured to, in the pressure feedback regulation mode, regulate an opening degree of the valve according to a difference between the fluid pressure detected by the pressure sensor and a target pressure corresponding to the target flow; and
the control module is configured to, in the flow feedback regulation mode, regulate the opening degree of the valve according to a difference between the fluid flow detected by the flow sensor and the target flow;
wherein the variation amount of the target flow refers to a difference between a target flow currently received by the control module and a previous target flow.

2. The mass flow controller of claim 1, wherein the control module is further configured to, before entering the pressure feedback regulation mode, acquire a valve opening degree value corresponding to the target flow, and regulate the opening degree of the valve according to the valve opening degree value until the fluid pressure detected by the pressure sensor meets a second stabilization condition.

3. The mass flow controller of claim 2, wherein a plurality of flow set points and valve opening degree values corresponding to the plurality of flow set points are stored in the control module; and
the control module is configured to perform a calculation by interpolation according to two of the plurality of flow set points closest to the target flow and valve opening degree values corresponding to the two of the plurality of flow set points to obtain the valve opening degree value corresponding to the target flow.

4. The mass flow controller of claim 3, wherein the valve is a solenoid valve, and each of the plurality of flow set points corresponding to an up opening degree value and a down opening degree value; and
the control module is configured to, in a case where the target flow is increased, perform the calculation by interpolation according to the two of the plurality of flow set points closest to the target flow and up opening degree values corresponding to the two of the plurality of flow set points to obtain the valve opening degree value corresponding to the target flow, and to, in a case where the target flow is decreased, perform the calculation by interpolation according to the two of the plurality of flow set points closest to the target flow and down opening degree values corresponding to the two of the plurality of flow set points to obtain the valve opening degree value corresponding to the target flow.

5. The mass flow controller of claim 1, wherein the flow sensor is a thermal flow sensor.

6. The mass flow controller of claim 2, wherein the first stabilization condition is: a difference between a maximum value and a minimum value among fluid flows detected by the flow sensor during a first preset time is not greater than a first preset difference; and the second stabilization condition is: a difference between a maximum value and a minimum value among fluid pressures detected by the pressure sensor during a second preset time is not greater than a second preset difference.

7. A flow control method of a mass flow controller, wherein the flow control method is applied to the mass flow controller of claim 1, and comprises:
in response to a variation amount of a target flow exceeding a preset threshold, regulating an opening degree of a valve according to a difference between a fluid pressure detected by the pressure sensor and a target pressure corresponding to the target flow; and
after a fluid flow detected by the flow sensor meets a first stabilization condition, regulating the opening degree of the valve according to a difference between the fluid flow detected by the flow sensor and the target flow.

8. The flow control method of claim 7, further comprising:
in response to the variation amount of the target flow value not exceeding the preset threshold, regulating the opening degree of the valve according to the difference between the fluid flow detected by the flow sensor and the target flow.

9. The flow control method of claim 7, wherein, before regulating the opening degree of the valve according to the difference between the fluid pressure detected by the pressure sensor and the target pressure corresponding to the target flow, the flow control method further comprises:
acquiring a valve opening degree value corresponding to the target flow, and regulating the opening degree of the valve according to the valve opening degree value; and
after the fluid pressure detected by the pressure sensor meets a second stabilization condition, performing the step of regulating the opening degree of the valve according to the difference between the fluid pressure detected by the pressure sensor and the target pressure corresponding to the target flow.

10. The flow control method of claim 9, wherein acquiring the valve opening degree value corresponding to the target flow comprises:
determining, according to a plurality of flow set points and valve opening degree information corresponding to the plurality of flow set points that are set in advance, two of the plurality of flow set points closest to the target flow and valve opening degree values corresponding to the two of the plurality of flow set points, and performing a calculation by interpolation to obtain the valve opening degree value corresponding to the target flow.

11. The flow control method of claim 10, wherein each of the plurality of flow set points corresponds to an up opening degree value and a down opening degree value; and
acquiring the valve opening degree value corresponding to the target flow comprises:
in a case where the target flow is increased, determining, according to the plurality of flow set points and up opening degree values corresponding to the plurality of flow set points that are set in advance, the two of the plurality of flow set points closest to the target flow and up opening degree values corresponding to the two of the plurality of flow set points, and performing the calculation by interpolation to obtain the valve opening degree value corresponding to the target flow; and
in a case where the target flow is decreased, determining, according to the plurality of flow set points and down opening degree values corresponding to the plurality of flow set points that are set in advance, the two of the plurality of flow set points closest to the target flow and down opening degree values corresponding to the two of the plurality of flow set points, and performing the calculation by interpolation to obtain the valve opening degree value corresponding to the target flow value.

* * * * *